United States Patent
Kaminsky

(10) Patent No.: US 11,159,038 B2
(45) Date of Patent: *Oct. 26, 2021

(54) SYSTEMS AND METHODS FOR IMPROVING CELL BALANCING AND CELL FAILURE DETECTION

(71) Applicant: UCAP Power, Inc., San Diego, CA (US)

(72) Inventor: Ilya Kaminsky, El Cajon, CA (US)

(73) Assignee: UCAP Power, Inc., San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/786,697

(22) Filed: Feb. 10, 2020

(65) Prior Publication Data

US 2020/0321785 A1    Oct. 8, 2020

Related U.S. Application Data

(63) Continuation of application No. 15/384,972, filed on Dec. 20, 2016, now Pat. No. 10,574,076.

(51) Int. Cl.
*H02J 7/00* (2006.01)
*G01R 31/3835* (2019.01)

(52) U.S. Cl.
CPC .......... *H02J 7/007* (2013.01); *G01R 31/3835* (2019.01); *H02J 7/0016* (2013.01); *H02J 7/0021* (2013.01)

(58) Field of Classification Search
CPC ...... H02J 7/007; H02J 7/0016; G01R 31/362; G01R 31/3835

USPC .......................................................... 320/128
See application file for complete search history.

(56) References Cited

U.S. PATENT DOCUMENTS

| | | | | |
|---|---|---|---|---|
| 3,217,179 A | | 11/1965 | Jiro et al. | |
| 4,348,661 A | * | 9/1982 | Lucchesi | G08B 13/126 330/9 |
| 5,446,349 A | * | 8/1995 | Bocan | H05B 41/34 315/241 P |
| 5,485,140 A | * | 1/1996 | Bussin | B60Q 9/003 200/61.42 |
| 5,729,420 A | * | 3/1998 | Joung | G02F 1/136204 361/111 |
| 5,814,954 A | * | 9/1998 | Suzuki | H02H 5/047 318/376 |

(Continued)

FOREIGN PATENT DOCUMENTS

WO   WO 2014/087211    6/2014

*Primary Examiner* — M Baye Diao
(74) *Attorney, Agent, or Firm* — Knobbe, Martens, Olson & Bear LLP

(57) ABSTRACT

In one aspect, an embodiment of this invention comprises an energy storage device balancing apparatus. The energy storage device balancing apparatus comprises a balancing circuit and an alarm circuit. Both the balancing circuit and the alarm circuit are coupled to the energy storage device. The balancing circuit is configured to monitor a voltage of the energy storage cell and dissipate energy from the energy storage cell if the voltage is at or above a first reference voltage. The alarm circuit is configured to generate an alarm when the voltage of the energy storage cell is at or above a second reference voltage and dissipate energy from the energy storage cell when the voltage is at or above the second reference voltage.

13 Claims, 4 Drawing Sheets

(56) References Cited

U.S. PATENT DOCUMENTS

| | | | | |
|---|---|---|---|---|
| 5,977,748 A * | 11/1999 | Okamura | H02J 7/345 | 320/118 |
| 6,075,378 A * | 6/2000 | Okamura | H02H 7/16 | 320/122 |
| 6,194,994 B1 * | 2/2001 | Curran | G08B 7/06 | 340/293 |
| 6,297,615 B1 * | 10/2001 | Crass | H01M 6/5033 | 320/112 |
| 6,316,917 B1 * | 11/2001 | Ohta | H02J 7/0016 | 320/166 |
| 6,348,724 B1 * | 2/2002 | Koomen | H01L 27/0255 | 257/577 |
| 6,405,148 B1 * | 6/2002 | Hayashi | G01R 31/2834 | 324/762.05 |
| 6,809,433 B2 * | 10/2004 | Nozu | H02J 7/0016 | 307/109 |
| 6,844,704 B2 | 1/2005 | Wilk et al. | | |
| 6,924,963 B2 * | 8/2005 | Young | H01L 27/0251 | 361/111 |
| 7,236,346 B2 * | 6/2007 | Yano | H02J 7/0016 | 324/428 |
| 7,459,888 B2 * | 12/2008 | Schulte | B60L 7/14 | 320/166 |
| 7,560,903 B2 * | 7/2009 | Thrap | G05F 1/70 | 320/166 |
| 7,816,891 B2 * | 10/2010 | Nebrigic | H02J 7/0022 | 320/136 |
| 7,855,863 B2 * | 12/2010 | Wang | H02H 9/046 | 361/56 |
| 8,288,999 B2 * | 10/2012 | Hsu | H02J 7/0014 | 320/137 |
| 8,427,105 B2 * | 4/2013 | Plett | H01M 10/486 | 320/116 |
| 8,598,847 B2 * | 12/2013 | Eberhard | B60L 3/0046 | 320/126 |
| 8,779,692 B2 * | 7/2014 | Oshima | H05B 45/50 | 315/308 |
| 9,104,129 B2 * | 8/2015 | Sasaki | H02J 7/0016 | |
| 10,931,123 B2 * | 2/2021 | Kaminsky | H02J 7/0026 | |
| 2001/0019256 A1 | 9/2001 | Olsson et al. | | |
| 2003/0076636 A1 * | 4/2003 | Ker | H01L 27/0262 | 361/56 |
| 2003/0214267 A1 | 11/2003 | Long | | |
| 2004/0021178 A1 * | 2/2004 | Larson | H01L 27/0255 | 257/355 |
| 2009/0019273 A1 | 1/2009 | French et al. | | |
| 2011/0074355 A1 | 3/2011 | Dao et al. | | |
| 2011/0140665 A1 | 6/2011 | Tamezane et al. | | |
| 2011/0204722 A1 * | 8/2011 | Kim | H02J 7/0016 | 307/77 |
| 2011/0316541 A1 * | 12/2011 | Earle | G01V 3/104 | 324/326 |
| 2012/0176718 A1 | 7/2012 | Jorgenson et al. | | |
| 2012/0274283 A1 * | 11/2012 | van Lammeren | H01M 10/441 | 320/118 |
| 2016/0301221 A1 | 10/2016 | Kaminsky | | |

* cited by examiner

SYSTEMS AND METHODS FOR IMPROVING CELL BALANCING AND CELL FAILURE DETECTION

CROSS-REFERENCE TO RELATED APPLICATIONS

The present application is a continuation application of U.S. application Ser. No. 15/384,972 filed on Dec. 20, 2016 and titled "SYSTEMS AND METHODS FOR IMPROVING CELL BALANCING AND CELL FAILURE DETECTION", the disclosure of which is incorporated herein in its entirety for all purposes.

BACKGROUND

Field

The present disclosure relates generally to energy storage devices and systems, such as batteries and capacitors modules and systems, including ultracapacitors and super-capacitors, and in particular, capacitors or batteries deployed in modules, each module containing some number of battery and/or capacitor cells.

Description of the Related Art

Various systems and techniques exist for balancing the voltage of individual cells in an energy storage system by discharging an excess cell voltage. However, prior approaches do not fully and efficiently dissipate excess cell voltage and require expensive components.

Additionally, systems and techniques for balancing modules may not be capable of discharging negative voltages in one or more of the individual cells that form the modules being balanced. These negative voltages may present problems in such systems.

Additionally, systems and techniques exist for detecting failure in an energy storage system and issuing an alarm, but they often fail due to excess voltages from the energy storage system. In some systems and techniques, separate but redundant alarm systems may be used to monitor and alert for various module-wide conditions. For example, an open cell condition in a module (e.g., where an entire voltage of the module, up to 750 volts (V) in this case) may be expressed on the alarm circuit of the module and may destroy the alarm circuit. Thus, a redundant circuit, capable of surviving a high voltage (e.g., 750V) is needed to provide a sustained alarm in varied conditions.

SUMMARY

Embodiments disclosed herein address the above-mentioned problems with prior art. The systems, methods and devices of this disclosure each have several innovative aspects, no single one of which is solely responsible for the desirable attributes disclosed herein.

Various embodiments of methods and devices within the scope of the appended claims each have several aspects, no single one of which is solely responsible for the desirable attributes described herein. Without limiting the scope of the appended claims, some prominent features are described herein.

In one aspect, an embodiment of this invention comprises an energy storage device balancing apparatus. The energy storage device balancing apparatus comprises a balancing circuit and an alarm circuit. Both the balancing circuit and the alarm circuit are coupled to the energy storage device. The balancing circuit is configured to monitor a voltage of the energy storage cell and dissipate energy from the energy storage cell if the voltage is at or above a first reference voltage. The alarm circuit is configured to generate an alarm when the voltage of the energy storage cell is at or above a second reference voltage and dissipate energy from the energy storage cell when the voltage is at or above the second reference voltage.

Additionally, in some embodiments of the aspect, the balancing circuit dissipates energy from the energy storage cell by conducting a discharging current through at least one of a passive dissipative component and an active dissipative component. In some embodiments, the alarm circuit dissipates energy from the energy storage cell by conducting a discharging current through at least one of a passive dissipative component and an active dissipative component.

In some aspects, the alarm circuit dissipates energy from the energy storage cell by conducting a discharging current through a resistor. In some aspects, the balancing circuit comprises a shunt regulator configured to operate in a comparator mode.

In another aspect, an embodiment of the invention comprises an energy storage device cell balancing apparatus. The energy storage device cell balancing apparatus comprises a first dissipative component and a second dissipative component, both coupled to an energy storage cell. The first dissipative component is configured to monitor a voltage of the energy storage cell dissipate energy from the energy storage cell if the voltage is at or above a positive threshold voltage by conducting a discharging current through the first dissipative component. The second dissipative component is configured to dissipate a negative voltage from the energy storage cell.

In some aspects, the second dissipative component is coupled in series to a diode, the diode configured to provide a path for discharge of the negative voltage of the energy storage cell through the second dissipative component. In some other aspects, the second dissipative component is further configured to dissipate positive energy from the energy storage cell if the voltage is at or above the positive threshold voltage by a discharging current through the second dissipative component when the cell is positively charged. In some embodiments, the first dissipative component is further configured to dissipate energy from the energy storage cell if the voltage is at or above the positive reference voltage by conducting a discharging current through the first dissipative component.

In some aspects, the second dissipative component comprises at least one of a passive dissipative component and an active dissipative component. In some other aspects, the second dissipative component comprises a resistor.

In an additional aspect, an embodiment of the invention comprises an overvoltage alarm conveying apparatus. The overvoltage alarm conveying apparatus comprises an overvoltage alarm circuit, a Zener diode, an isolating device, and a current limiting circuit. The overvoltage alarm circuit is configured to generate an overvoltage alarm signal based on a received overvoltage signal. The isolating device is configured to provide an isolated output signal. The current limiting circuit is configured to provide a current flow through the Zener diode to the isolating device when exposed to a voltage exceeding a rating of the Zener diode. The Zener diode, the isolating device, and the current limiting circuit are configured to maintain the overvoltage alarm signal generated by the overvoltage alarm circuit if the overvoltage alarm circuit is unable to maintain the overvoltage alarm signal itself.

BRIEF DESCRIPTION OF THE DRAWINGS

Details of one or more embodiments of the subject matter described in this disclosure are set forth in the accompanying drawings and the description below. Although the examples provided in this disclosure are sometimes described in terms of capacitors or capacitor cells, the concepts provided herein may apply to other types of energy storage systems. Other features, aspects, and advantages will become apparent from the description, the drawings and the claims. Note that the relative dimensions of the following figures may not be drawn to scale.

DETAILED DESCRIPTION

Figure 1:
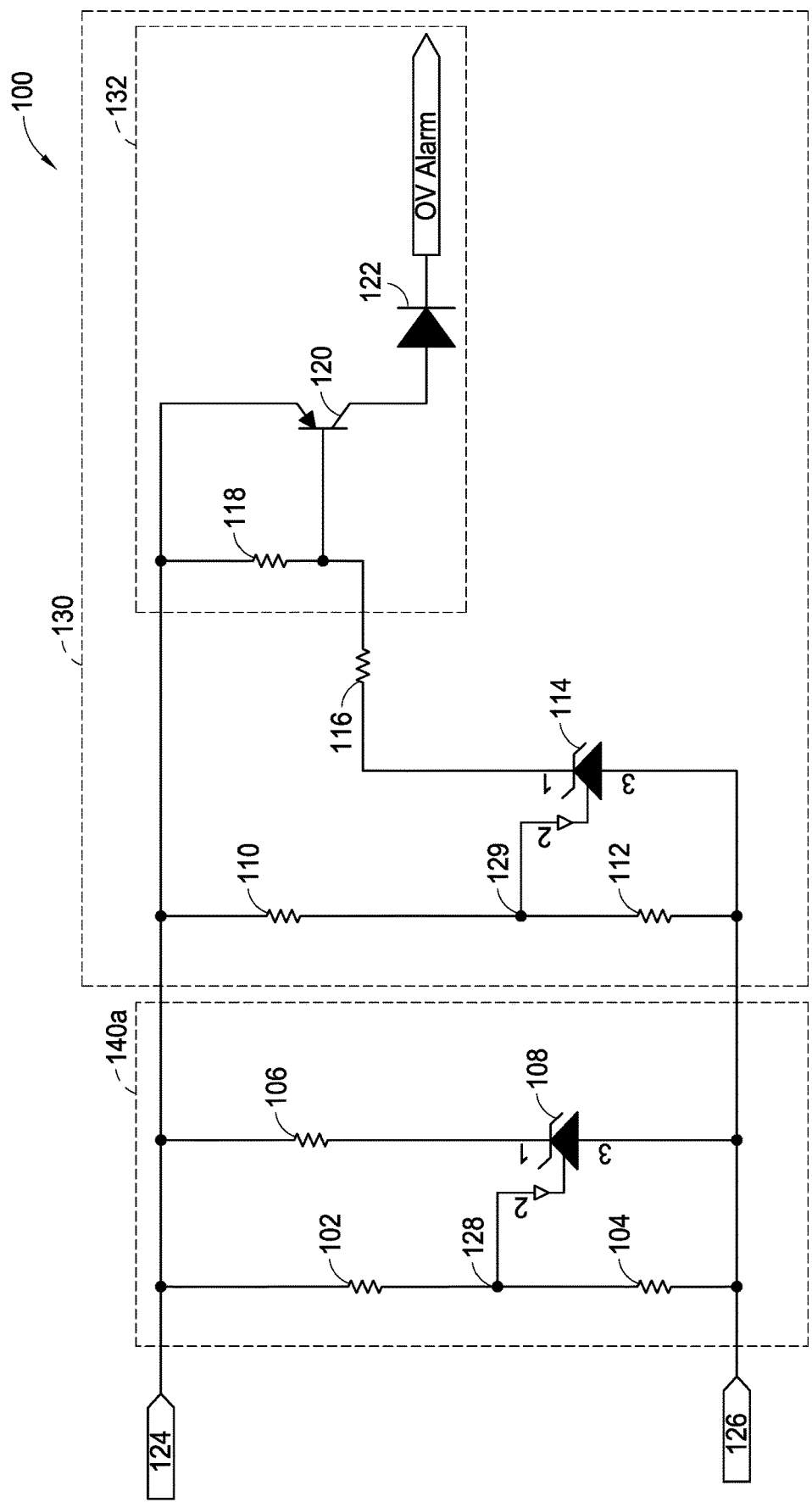
FIG. 1 illustrates an embodiment of a balance and overvoltage alarm circuit comprising a balancing circuit in which an integrated alarm circuit discharges voltage when the balance and overvoltage alarm circuit is exposed to a cell or module experiencing an overvoltage condition.

The detailed description set forth below in connection with the appended drawings is intended as a description of exemplary embodiments and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specified details for the purpose of providing a thorough understanding of the exemplary embodiments. In some instances, some devices are shown in block diagram form.

Energy storage systems can include a plurality of individual battery or ultracapacitor cells arranged in series to form an energy storage module or bank which has a higher voltage output than an individual cell. The modules in turn can be connected in series with other modules to output higher combined voltages. The individual capacitors or batteries of a module are sometimes referred to as capacitor cells or battery cells, respectively, or more generally, cells.

Excessive cell voltage can damage an individual cell, the module in which the cell is located, or both. Cell balancing circuits ("balancing circuits") can be used to discharge battery or ultracapacitor cells to equalize cell voltages and prevent or minimize damage caused by excessive cell voltage conditions. Such excessive cell voltage can be discharged by one or more of a passive component, for example one or more resistors, and an active component, for example one or more transistors or regulators, in the balancing circuit.

A passive dissipative component may be unable to individually control a flow of current, while an active dissipative component may be capable of controlling current flow. Both active and passive dissipative components may dissipate voltage. In some embodiments, the passive dissipative components may discharge voltage through constant current discharge or through resistive discharge. In the case of a constant current discharge circuit, a constant discharge current is drawn from the cell, independent of the cell voltage or the voltage being discharged. A resistive discharge circuit draws a discharge current that is proportional to the cell voltage. As the voltage of the cell increases, the discharge current also increases and vice versa. Examples of passive dissipative components may include fixed resistors, variable resistors, thermistors, passive attenuators, potentiometers, etc. Examples of active dissipative components may include transistors, regulators, active attenuators, active diodes, etc.

Some of the embodiments of the balancing circuits described herein allow for splitting the actual voltage dissipation between both the active and passive components. This may increase the efficiency of the voltage dissipation, may reduce the number of components needed, and may eliminate the need for some expensive active or passive components, relative to previous cell balancing circuits.

Improved Cell Balancing Circuit

In some embodiments, the cell balancing circuits described herein are coupled to one or more alarm circuits. These alarm circuits may provide an indication of an overvoltage condition to a user or to an external circuit. For example, the alarm circuits may be coupled to an indicator light or an audible alarm.

In some embodiments, the cell balancing circuits comprising the active and passive dissipative components may be limited in their overvoltage discharge rates. Balanced cells increase available energy from the module. Accordingly, faster balancing allows faster arrival at a maximum energy state for the module. In some embodiments, additional active and/or passive dissipative components may be added to the balancing circuits, thus increasing the cost and complexity of the balancing circuits. Alternatively, or additionally, in some embodiments, the overvoltage alarm circuit may provide voltage dissipation in conjunction with the voltage dissipation properties of the active and/or passive dissipative components of the balancing circuit. By combining the alarm functions with the balancing functions, total cost for the balancing circuits and alarm circuits can be reduced.

FIG. 1 illustrates an embodiment of a balance and overvoltage alarm circuit 100 comprising a balancing circuit 140a and an integrated balancing and alarm circuit 130. The balancing circuit 140a may discharge voltage when coupled to a cell or module experiencing an overvoltage condition. The balancing and alarm circuit 130 may also discharge voltage when coupled to the cell or module the overvoltage condition that triggers the alarm. The balance and overvoltage alarm circuit 100 may be coupled to or may include an energy storage cell. For example, the balance and overvoltage alarm circuit 100 may be external to and connected in parallel to the energy storage cell, for example at nodes 124 and 126. The energy storage cell can include single or multiple batteries, capacitors, ultracapacitors or other alternative means of energy storage, or can be combined with a plurality of similar cells, each with a corresponding balance and overvoltage alarm circuit, to form an energy storage module. Thus, in some embodiments, a plurality of balance and overvoltage alarm circuits 100 can be implemented for use on a module, with each overvoltage alarm circuit providing functionality to a corresponding cell within the module. For ease of description herein, the energy storage cell may include either the single cell or the module either internal or external to the balance and overvoltage alarm circuit 100.

The balancing circuit 140*a* of the balance and overvoltage alarm circuit 100 can include one or more shared-dissipation balancing circuits, illustrated here as shared-dissipation balancing circuit 140*a*. More or fewer shared-dissipation balancing circuits 140*a* may be included in the balance and overvoltage alarm circuit 100 than shown in FIG. 1. In some embodiments, other circuit variations of dissipating balancing circuits 140 may be included in the balance and overvoltage alarm circuit 100. The shared-dissipation balancing circuit 140*a* shown in FIG. 1 may include a resistive divider, an active dissipative component, and a passive dissipative component. For the shared-dissipation balancing circuit 140*a*, the resistive divider may comprise resistors 102 and 104; the active dissipative component may comprise a shunt regulator 108; the passive dissipative component may comprise a resistor 106.

The resistive divider comprising resistors 102 and 104 may allow the active dissipative component 108 to conduct a discharging current at a voltage value different than a built-in reference value of the active dissipative component 108. For example, the resistors 102 and 104 may offset an initial voltage from which the active dissipative component 108 begins conducting a discharge current. Thus, the resistive divider formed from the resistors 102 and 104 may allow the active dissipative component 108 to be more versatile and enable usage in more voltage ranges.

The active dissipative component 108 can comprise a three-terminal device, having terminals 1, 2, and 3. The terminal 1 can be a reference terminal connected to a node 128 between the resistors 102 and 104 of the dissipating balancing circuit 140*a*. Thus, the active component 108 may monitor a voltage of the resistor divider at the node 128. If the voltage of the resistive divider at the node 128 rises above a threshold voltage, for example 2.5 volts (V), the active dissipative component 108 can allow a discharging current to flow from the energy storage cell through the active component terminals 2 and 3 and the passive dissipative component 106, thus causing the excess cell voltage of the energy storage cell to dissipate across both the active and passive components 108 and 106, respectively.

In some embodiments, a shunt regulator, for example a Texas Instruments® TL431 shunt regulator, can be used to implement the active dissipative component 108. The active component 108 may monitor the voltage of the energy storage cell by configuring the shunt regulator in a comparator mode with a preset or built-in reference voltage, for example 2.5V. In some embodiments, the preset or built-in reference voltage may be user settable. The active dissipative component 108 can further include an output transistor (not shown). When the voltage of the energy storage cell exceeds the reference voltage, the comparator may activate or turn on the output transistor in an unsaturation mode, thereby causing a discharging current to flow through both the passive component 106 and the active component 108 and causing both the passive component 106 and the active component 108 to dissipate excess cell voltage. In some embodiments, the output transistor of the active component 108 may maintain a maximum constant voltage drop across the active component 108. For example, in some embodiments this maximum constant voltage drop can be approximately 2 V. Any additional excess cell voltage of the energy storage cell is dropped (or dissipated) across the passive component 106. In some embodiments, the passive component 106 may comprise any device or set of devices configured to passively dissipate voltage. In some embodiments, the active component 108 may comprise any devices or set of devices configured to monitor a voltage and actively dissipate voltage. In some embodiments, the active component 108 may comprise separate devices that measure the voltage and control active voltage dissipation and flow. Accordingly, dissipation in the balancing circuit 140*a* may be shared between both the passive and active dissipative components 106 and 108, respectively.

The balancing circuit of the integrated balancing and alarm circuit 130 can function similarly to balancing circuit 140*a*. The shared dissipation of the balancing circuit of the integrated balancing and alarm circuit 130 may allow for more efficient voltage dissipation, as well as fewer parts, and lower cost components, and thus lower overall cost as compared to the dissipating balancing circuit 140*a*, among other benefits, than balancing circuits with solely active or solely passive components. In some embodiments, such benefits can be recognized, even when two or more shared-dissipation circuits are implemented, while improving additional functional improvements, such as speed of dissipation.

The balancing circuit of the balancing and alarm circuit 130 may comprise resistors 110 and 112; the active dissipative component may comprise a shunt regulator 114; the passive dissipative component may comprise a resistor 116. The overvoltage alarm circuit 132 of the balancing and alarm circuit 130 may comprise a resistor 118, a transistor 120, and a diode 122. In some embodiments, the overvoltage alarm circuit 132 may feed a summing circuit or similar circuit, where the overvoltage alarm circuits from a plurality of cells or modules are monitored together. The transistor 120 may act as a switch controlled by the shunt regulator 114 of the balancing and alarm circuit 130. The resistor 118 may be shunted by an emitter-base junction of transistor 120. In some embodiments, the shut regulator 114 may be replaced with an integrated circuit configured to perform similar functions.

In some embodiments, one or both of the balancing circuit 140*a* and the balancing circuit of the balancing and alarm circuit 130 may be replaced by alternative balancing circuits.

An alternative balancing circuit may include an active component having two terminals for voltage inputs and an output terminal. The active component of this alternative balancing circuit can monitor the voltage of the coupled cell via the voltage input terminals and output a signal at its output terminal if the voltage of the coupled cell rises above a predetermined threshold voltage. The other alternative balancing circuit can additionally include resistors and a transistor. The output signal from the active component can be provided, via a first of the resistors, to the transistor. The transistor can act as a switch controlled by the signal output, where the signal output activates or turns on the transistor. When the transistor activates, it creates a path from the coupled cell through a second resistor and the transistor, thereby providing a resistive discharge (variable current) that may dissipate the excess voltage of the coupled cell. This other alternative balancing circuit may mainly dissipate the excess cell voltage through the second resistor. The first resistor and transistor may not contribute significantly to discharging the excess cell voltage.

A second alternative balancing circuit can also be coupled to the cell and may include an active component and a passive component. The active component can be a three-terminal device. One of the terminals can be a reference terminal by which the active component may monitor the voltage of the coupled cell. If the voltage of the coupled cell rises above a threshold voltage, the active component can allow a discharging current to flow from the coupled cell through the active component and the passive component, thus causing the excess cell voltage to dissipate across both the active and passive components. In some embodiments, as described herein, a shunt regulator, for example a Texas Instruments® TL431 shunt regulator, can be used to implement the active component.

A third balancing circuit may be similar in structure to the second, shared-dissipation balancing circuit. The third balancing circuit may be a linear embodiment of the second balancing circuit. Accordingly, the reference terminal of the active component of the third balancing circuit may couple to a node between the active component and the passive component. Thus, the active component can be configured to monitor the voltage at this node.

The balance and overvoltage alarm circuit 100 may discharge an overvoltage cell or module faster than a balancing circuit alone. In some embodiments, the balance and overvoltage alarm circuit 100 may provide a multi-stage balancing method. For example, the balancing circuit 140a of the balance and overvoltage alarm circuit 100 may provide a first stage of balancing while the balancing and alarm circuit 130 may provide a second stage of balancing. Accordingly, the balancing and alarm circuit 130 may dissipate voltage only when the voltage of the coupled cell exceeds a second specified threshold, while the balancing circuit 140a may dissipate voltage when the voltage of the coupled cell exceeds a first specified threshold that is different than and lower than the second specified threshold. For example, there may be three states of voltage dissipation: (1) a state where neither the balancing circuit 140a nor the balancing and alarm circuit 130 dissipate voltage (voltage of the cell is less than both the first and second specified thresholds); (2) a state where only the balancing circuit 140a is dissipating voltage (voltage of the cell is greater than the first specified threshold but less than the second specified threshold); and (3) a state where both the balancing circuit 140a and the balancing and alarm circuit 130 both dissipate voltage (voltage of the cell is greater than both the first and second specified thresholds).

In some embodiments, the balance and overvoltage alarm circuit 100 may be integrated into cell management systems or in other systems where the cell or module balance voltage or level is below an overvoltage alarm voltage or level. Accordingly, in some embodiments, the balancing and alarm circuit 130 may only be used as a dissipative component when the cell or module overvoltage exceeds a specified threshold, for example an overvoltage that activates the overvoltage alarm. The specified threshold may be equal to or greater than, but not less than the threshold at which the balancing circuit 140a acts to dissipate voltage from an overvoltage cell or module. Thus, the balance and overvoltage alarm circuit 100 may be configured to utilize one or both of the balancing circuit 140a and the balancing and alarm circuit 130 to dissipate the overvoltage cell or module in any given instance, while the overvoltage alarm circuit 132 indicates the overvoltage alarm condition while the balancing circuit of the balancing and alarm circuit 130 dissipates voltage.

Embodiments of the circuit(s) described herein may improve efficiency of the excess voltage discharge compared to other circuits, where the benefits of one or both of the constant current discharge and the proportional discharge can be maintained and implemented as both the active and passive components participate in the excess voltage discharge. Additionally, the improved circuits may allow for more diverse applications where the circuit may require fewer, less expensive (and smaller) components and thus may require less space to be implemented. The balancing and alarm circuit 130 may provide additional cell discharge current and thus increase balance current when there is an active overvoltage alarm. The balancing and alarm circuit 130 may draw additional balance current to accelerate discharge of the coupled cell with a charge above the overvoltage limit, thus providing for equalization of cell voltages more quickly than the balancing circuit 140a operating alone but without adding additional components to the overall system. The combined balance and overvoltage alarm circuit may be applied to cell management systems where the balance level is less than an overvoltage alarm level where cell balancing using the balancing circuit 140a begins before cell balancing using the balancing and alarm circuit 130.

Negative Charge Dissipation Circuit

In some embodiments, the cell balancing circuits described herein are coupled to one or more modules comprising a plurality of cells. When dissipating voltage from these modules, for example from a high current down to a low voltage (e.g., zero volts), it is possible that one or more of the plurality of cells may result in a negative (or reverse) voltage while the overall module measures the low voltage (e.g., zero volts). For example, although the module measures approximately zero volts, it is possible that one cell forming the module has a voltage of +1V while another cell forming the module has a voltage of −1V. A negatively charged cell may be dangerous in a module comprising a plurality of cells. In some embodiments, a negatively charged cell may reduce an overall voltage of the module comprising the negatively charged cell. In some embodiments, a negative voltage in a cell may shorten the life of the cell. However, the balancing circuit for the cells forming the module may include components that are capable of discharging the negative voltage.

Figure 2:
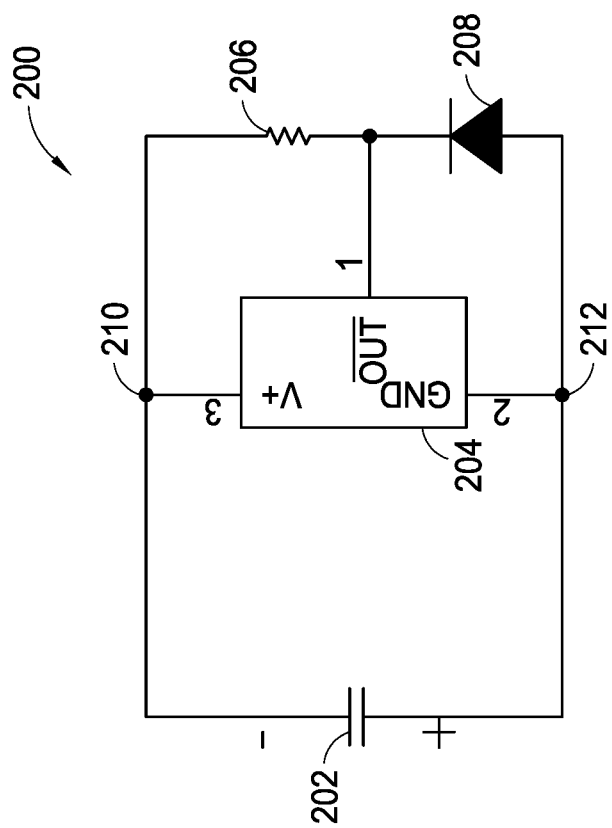
FIG. 2 illustrates an embodiment of a balancing circuit in which a dissipative component discharges a negatively charged cell to which the balancing circuit is coupled when the dissipative component is coupled in series to a diode.

FIG. 2 illustrates an embodiment of a balancing circuit 200 comprising a dissipative component 206 which discharges a negatively charged cell to which the balancing circuit 200 is coupled. The dissipative component 206 can be coupled in series to a diode 208, which also dissipates at least a portion of the voltage of the negatively charged cell to which the diode 208 is coupled. The balancing circuit 200 may be coupled to or may include an energy storage cell. For example, the balancing circuit 200 may be external to and connected in parallel to the energy storage cell, for example at nodes 210 and 212. The energy storage cell can include single or multiple batteries, capacitors, ultracapacitors or other alternative means of energy storage, or can be combined with a plurality of similar cells, each with a corresponding balance and overvoltage alarm circuit, to form an energy storage module. For ease of description herein, the energy storage cell may include either the single cell or the module either internal or external to the balancing circuit 200. For example, the single cell may comprise an ultracapacitor cell 202.

The balancing circuit 200 can further include an additional dissipative component, such as an active component 204. The active component 204 can have two terminals (terminals 2 and 3) for voltage inputs, and an output terminal 1. In some embodiments, the active component 204 may be configured to monitor and dissipate positive voltage from the cell 202 if the monitored positive voltage exceeds a first threshold. For example, the threshold voltage may be 1.5 V, and once the voltage of the cell 202 rises above 1.5 V, the active component 204 may dissipate any positive voltage above the 1.5V threshold. However, as discussed above, the active component 204 may be unable to detect and/or dissipate a negative voltage in the cell 202.

The dissipative component 206 may be coupled to the node 210 and the diode 208. The dissipative component 206 may comprise a passive dissipative component, for example a resistor as shown. However, the dissipative component may comprise any active or passive dissipative component based on specifics of the applied system, including desired costs, desired functionality, etc.

The balancing circuit 200 also includes the diode 208. The diode 208 may be coupled between the node 212 and the dissipative component 206. In some embodiments, the diode 208 may allow current flow in one direction when a voltage difference across the diode 208 exceeds a specified threshold as defined by the diode (e.g., 0.6-0.7V difference between an anode and a cathode of the diode). As soon as cell voltage is more negative than 0.6-0.7V, the diode 208 may become forward biased and may start conducting and dissipating negative charge on the dissipative component 206 and the diode 208 itself. The diode voltage drop may remain at 0.7V. As shown, the diode 208 allows current flow from the node 212 through the diode 208 and through the dissipative component 206 to the node 210 when the ultracapacitor cell 202 is negatively charged.

In some embodiments, the diode 208 may be integrated with the active component 204 as part of an integrated circuit (not shown) to protect the integrated circuit. In such embodiments, the diode 208 may be considered an "anti-parallel diode". Additionally, the integrated circuit may include both the diode 208 (e.g., the antiparallel diode) and also the dissipative component 206 (not shown). For example, the active component 204 of the integrated circuit may be configured to dissipate positive voltage (as described herein) while allowing for discharge of negative voltage through the anti-parallel diode and the integrated dissipative component.

In some embodiments, a shunt regulator, for example a Texas Instruments® TL431 shunt regulator, can be used to implement the active component 204. The active component 204 may comprise any comparator or integrated circuit designed to detect positive voltage differences. In some embodiments, the active component 204 may comprise any devices or set of devices configured to monitor a positive voltage and actively dissipate the positive voltage. In some embodiments, the active component 204 may comprise separate devices that measure the positive voltage and control active positive voltage dissipation and flow. In some embodiments, positive voltage dissipation in the balancing circuit 200 may be shared between both passive and active dissipative components. For example, both the active component 204 and the dissipative component 206 may dissipate positive voltage, where the dissipative component 206 is a passive component (e.g., the resistor).

Figure 3:
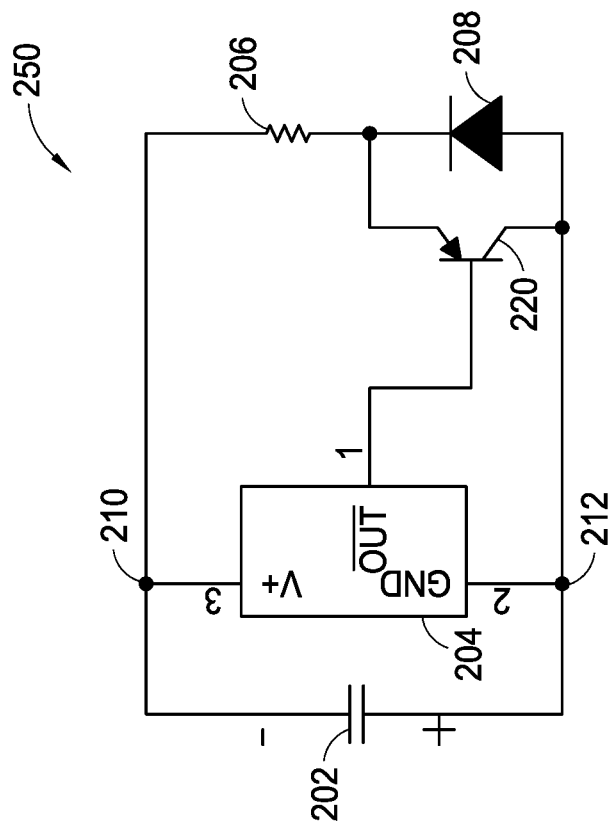
FIG. 3 illustrates another embodiment of a balancing circuit in which a dissipative component discharges the negatively charged cell to which the balancing circuit is coupled when the dissipative component is coupled in series to a diode that is parallel to a controlled switch.

FIG. 3 illustrates an embodiment of a balancing circuit 250. The balancing circuit 250 may be coupled to or may include the energy storage cell 202. The balancing circuit 250 can include the active component 204, the dissipative component 206, and the diode 208, similar to those components described above in relation to the balancing circuit 200 and the cell 202, which will not be described again for purposes of brevity.

In this embodiment, the output signal of the active component 204 may control a transistor 220, which in turn may control current flow through the dissipative component 206 for positive voltage dissipation. The current flow through the transistor 220 and the dissipative component 206 may be opposite in direction to current flow through the diode 208 and the dissipative component 206 for negative voltage dissipation. The transistor 220 may be coupled to the node 210 and the dissipative component 206 in parallel to the diode 208. The transistor 220 may provide a current path through the dissipative component 206 when the ultracapacitor cell 202 is positively charged, not shown here.

The balancing circuits 200 and 250 as described in relation to FIGS. 2 and 3 may utilize the dissipative component 206 (e.g., the resistor) to discharge the negatively charged cell (e.g., the ultracapacitor 202) coupled to the balancing circuits 200 and 250 via the diode 208. In some embodiments, the diode 208 may be an integrated in an integrated circuit with one or more of the active component 204 and the transistor 220 as the anti-parallel diode. Regardless of the configuration of the balancing circuits 200 and 250, the balancing circuits 200 and 250 are capable of discharging negatively charged modules or cells quickly and safely via the diode 208 and the dissipative component 206 (which may be active or passive).

Combined Cell, Module, and Redundant Overvoltage Alarm Circuit

As described herein, modules or cells may comprise overvoltage alarm circuits. In some applications, individual-cell overvoltage detector or alarm circuits or module overvoltage detector or alarm circuits generate the alarm. The cell and module alarm circuits may provide an indication of an overvoltage condition to a user or to an external circuit. For example, the alarm circuits may be coupled to an indicator light or an audible alarm. Additional alarm monitoring circuits can monitor or look for these alarms periodically. When a system comprises both cell and module overvoltage alarm circuits, alarms generated by the module circuits and alarms generated by the cell circuits may be individually communicated to the alarm monitoring circuits, for example using individual optocouplers.

One of the most catastrophic failures in serially connected modules is an open cell failure. In such a failure, the entire voltage of the string of cells (e.g., in this specific case 750V) may be expressed across the alarm monitoring circuit of one cell or one module. This high voltage may destroy or otherwise incapacitate the existing overvoltage alarm circuit and may stop the overvoltage alarm being generated.

A redundant or open cell overvoltage alarm circuit may survive such an event and continue to send the overvoltage alarm to the user or the external circuit even if the rest of the circuit (e.g., the alarm monitoring circuit) is destroyed. This redundant circuit cannot be reset as long as high voltage is present, and thus will maintain the overvoltage alarm as long as the overvoltage condition exists. In some embodiments, the overvoltage alarm monitoring circuits and the redundant circuits may be integrated into a simpler combined circuit, which results in fewer components between the two circuits.

Figure 4:
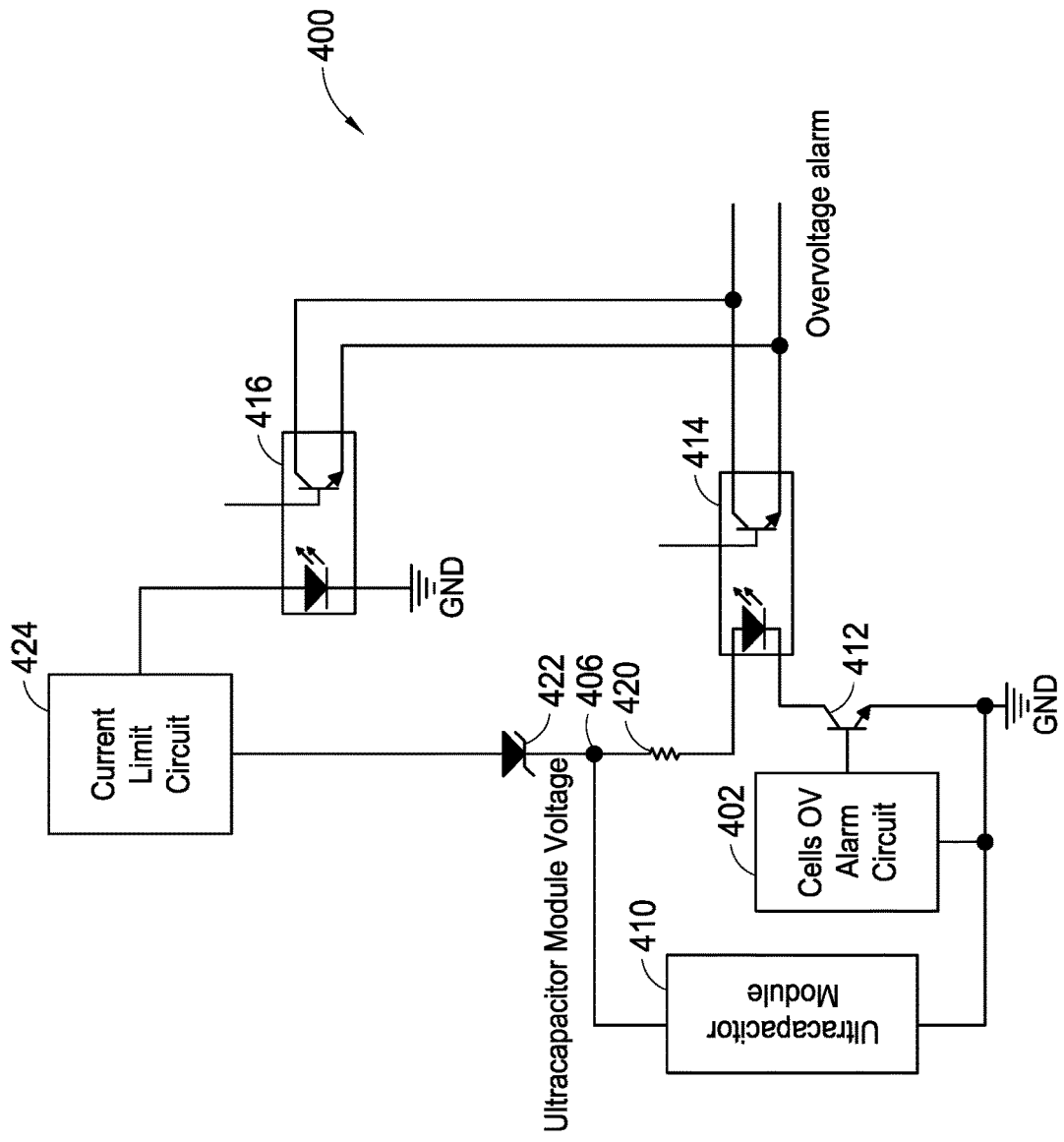
FIG. 4 illustrates an embodiment of an alarm system 400 comprising a redundant cell overvoltage alarm circuit 402 for communication of overvoltage conditions to an external alarm monitoring circuit.

FIG. 4 illustrates an embodiment of an alarm system 400 comprising a cell overvoltage alarm circuit 402 for communication of overvoltage conditions to an external alarm monitoring circuit. The alarm system 400 includes the cell overvoltage alarm circuit 402, the ultracapacitor module 410, a transistor 412, a first optocoupler 414 and resistor 420. A second, redundant overvoltage alarm system consists of the optocoupler 416, a Zener diode 422, and a current limit circuit 424 in series with the optocoupler 416. A node 406 voltage to ground is a single module voltage under normal conditions and a whole series string of modules voltage during and after an open cell failure condition. The first and second optocouplers 414 and 416, respectively, may be coupled to or part of the external alarm monitoring circuit. As shown in the alarm system 400, when one or more of the cells of the module experience an overvoltage condition, the individual alarm circuit (e.g., the alarm circuit 132 of FIG. 1) may activate and output an alarm signal. The corresponding output alarm signals from each of a plurality of cells forming a particular module may be coupled together to create a combined output of the cell overvoltage alarm circuit 402. This combined output may then control the transistor 412. Thus, when one of more of the cells of the module experience the overvoltage condition, the output alarm signal of the cell overvoltage alarm circuit 402 may turn on or activate the transistor 412. By turning on the transistor 412, a current path is created from the ultracapacitor module 410 (e.g., at node 406) through the resistor 420, the optocoupler 414, and the transistor 412 to ground. Accordingly, when one of the cells experience the overvoltage condition, the transistor 412 closes and current passes through the optocoupler 414, conveying the overvoltage condition to a secondary system (not shown).

For the redundant overvoltage alarm circuit, the Zener diode 422 is coupled between the node 406 and the current limit circuit 424 to make sure that redundant alarm starts operating at a voltage higher than single module voltage. The Zener diode 422 may offset a full positive voltage of the ultracapacitor module 410 based on a Zener voltage of the Zener diode 422. In some embodiments, the Zener voltage may be set based on the single module voltage. The current limit circuit 424 may limit current through the optocoupler 416 and can survive indefinitely very high voltage (e.g., 750V) in our embodiment. In some embodiments, the current limit circuit limits currents to a safe level (e.g., 5 mA) regardless of the voltage applied (e.g., up to 800V).

In some embodiments, the optocouplers 414 and 416 may be isolating signal transfer devices between two circuits or systems (e.g., isolating the potentially dangerous ultracapacitor module full string voltage from a secondary instrumentation system). Alternative alarm devices can be used in lieu of the optocouplers 414 and 416. In some applications, the secondary system can be implemented in a dashboard or display of a vehicle comprising the cells and modules having the cell overvoltage alarm circuit 402, where the generated alarm can be seen by a vehicle operator, for example via illumination of an LED or other visually, audibly, or tactilely perceivable means. In some embodiments, the alarm may be communicable such that a remote operator or viewer may track the alarm.

As shown, the overvoltage alarm circuit 402 and the current limit circuit 424 and corresponding alarm signals duplicate some components, most notably the optocouplers 414 and 416. Additionally, in order to activate the overvoltage alarm output signal and activate the optocoupler 414, the ultracapacitor module 410 (and the node 406) may be at a minimum voltage that would activate the optocoupler 414 after being reduced by the resistor 420. In some embodiments, a value and a power rating of the resistor 420 (or similar component) may be selected to limit current through optocoupler 414 when the module voltage is at a highest nominal module voltage. Accordingly, this value and/or power rating establishes a certain minimum module voltage necessary for operation of the optocoupler 414.

Figure 5:
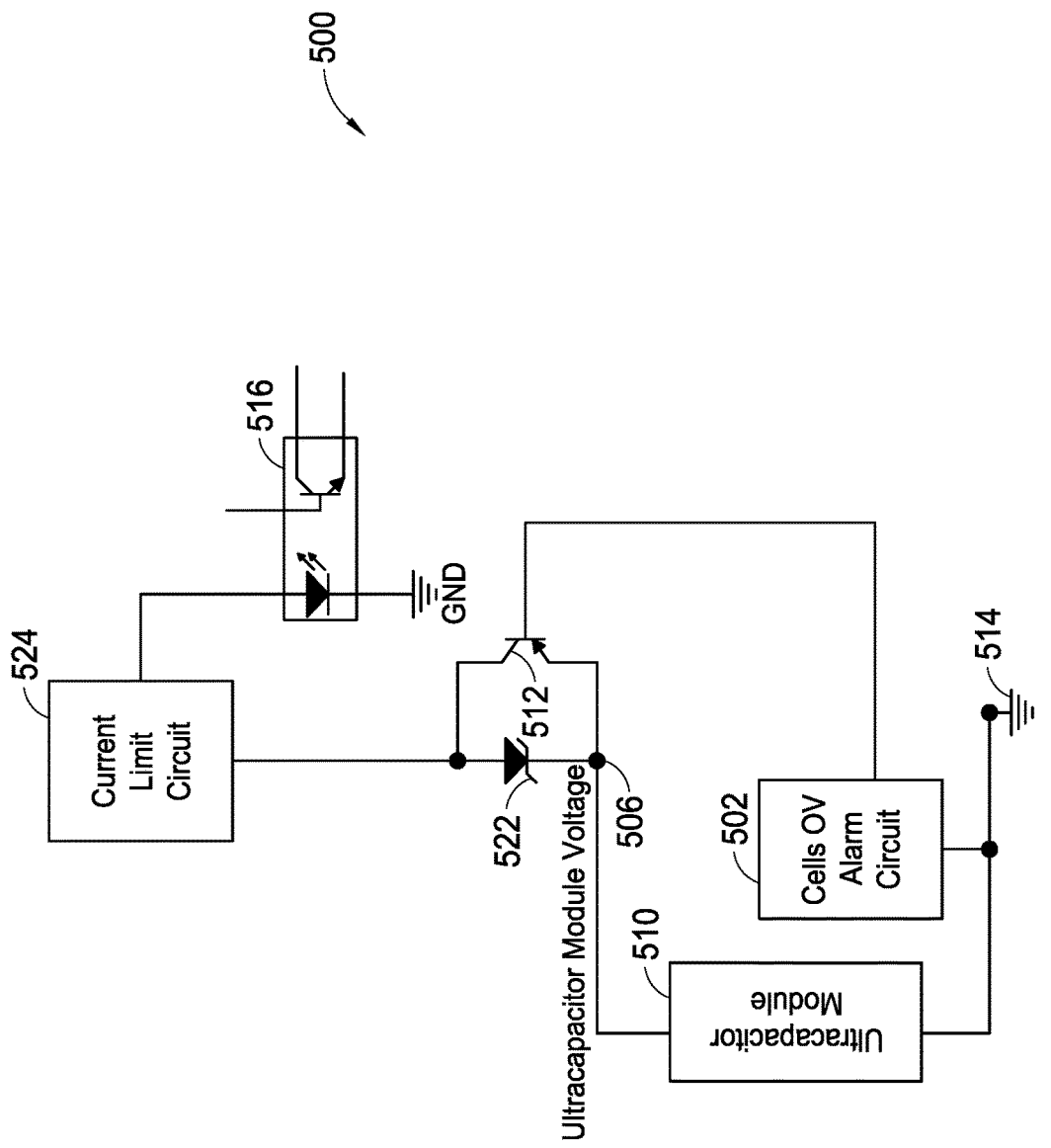
FIG. 5 illustrates an embodiment of an alarm system comprising a combined cell and module overvoltage alarm circuit for communication of overvoltage conditions to the external alarm monitoring circuit.

FIG. 5 illustrates an embodiment of an alarm system 500 for communication of overvoltage conditions to an external alarm monitoring circuit, such as the external alarm monitoring circuit described herein with reference to FIG. 4. The alarm system 500 shares many of the components with similar numbering scheme as the alarm system 400. Details of such shared components are described above in relation to the alarm system 400 and will not be described again for purposes of brevity.

As shown in the alarm system 500, when one or more of the cells of the module experience an overvoltage condition, the individual alarm circuit (e.g., the alarm circuit 132 of FIG. 1) may activate and output an alarm signal. The output alarm signals from a plurality of cells forming a particular module may be coupled together to create an output of the cell overvoltage alarm circuit 502. This combined output or any cell overvoltage signal may then control the transistor 512. When one of more of the cells of the module experience the overvoltage condition, the output alarm signal of the cell overvoltage alarm circuit 502 may turn on or activate the transistor 512. By turning on the transistor 512, a current path is created from the ultracapacitor module 510 (e.g., at node 506) through the transistor 512 and through the optocoupler 516 to ground. Accordingly, when one of the cells experiences the overvoltage condition, the transistor 512 closes and current passes through the current limit circuit 524 and the optocoupler 516, conveying the overvoltage condition to the secondary system (not shown). The current limit circuit 424 may limit current through the optocoupler 516 similar to as described above in relation to FIG. 4 and the alarm system 400.

The alarm system 500 eliminates the optocoupler 414 and the resistor 410 while changing the transistor 412 from an NPN transistor to a PNP transistor 512. Additionally, the transistor 512 is parallel to the Zener diode 522. By reducing the number of components, costs and complexity of the entire alarm system 500 are reduced as compared to the alarm system 400. Additionally, by shorting Zener diode 512 in normal mode of overvoltage operation, the ultracapacitor module 510 may have a reduced module voltage while generating a single cell voltage overvoltage alarm in case of single cell overvoltage in a discharged module. As shown, the FIG. 5 circuit structure may require fewer components and reduced circuit complexity as compared to the FIG. 4 circuit. Additionally, as the current limit circuit 524 may pass a low current through the optocoupler 516 and can operate at very high voltage indefinitely, the current limit circuit 524 may maintain the redundant overvoltage alarm signal through the optocoupler 516. Accordingly, a circuit board layout may allow for destruction of the regular overvoltage alarm, while the redundant alarm remains operational. Thus the cell overvoltage alarm circuit 502 and the transistor 512 may be destroyed but the Zener diode 522, the current limit circuit 524, and the optocoupler 516 may continue to operate and output the overvoltage alarm signal.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules, circuits, and method steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such embodiment decisions should not be interpreted as causing a departure from the scope of the embodiments.

The various illustrative blocks, modules, and circuits described in connection with the embodiments disclosed herein may be implemented or performed with a general purpose hardware processor, a Digital Signal Processor (DSP), an Application Specified Integrated Circuit (ASIC), a Field Programmable Gate Array (FPGA) or other programmable logic device, discrete gate or transistor logic, discrete hardware components, or any combination thereof designed to perform the functions described herein. A general purpose hardware processor may be a microprocessor, but in the alternative, the hardware processor may be any conventional processor, controller, microcontroller, or state machine. A hardware processor may also be implemented as a combination of computing devices, e.g., a combination of a DSP and a microprocessor, a plurality of microprocessors, one or more microprocessors in conjunction with a DSP core, or any other such configuration.

The steps of a method and functions described in connection with the embodiments disclosed herein may be embodied directly in hardware, in a software module executed by a hardware processor, or in a combination of the two. If implemented in software, the functions may be stored on or transmitted as one or more instructions or code on a tangible, non-transitory computer readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the hardware processor such that the hardware processor can read information from, and write information to, the storage medium. In the alternative, the storage medium may be integral to the hardware processor. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer readable media. The hardware processor and the storage medium may reside in an ASIC.

For purposes of summarizing the disclosure, certain aspects, advantages and novel features have been described herein. It is to be understood that not necessarily all such advantages may be achieved in accordance with any particular embodiment. Thus, the invention may be embodied or carried out in a manner that achieves or optimizes one advantage or group of advantages as taught herein without necessarily achieving other advantages as may be taught or suggested herein.

Various modifications of the above-described embodiments will be readily apparent, and the generic principles defined herein may be applied to other embodiments without departing from the spirit or scope of the application. Thus, the present application is not intended to be limited to the embodiments shown herein but is to be accorded the widest scope consistent with the principles and novel features disclosed herein.

What is claimed is:

1. An energy storage device cell balancing apparatus comprising:
    a first dissipative component that, when coupled to a positively charged energy storage cell, is configured to:
        monitor a positive voltage of the positively charged energy storage cell; and
        dissipate energy from the positively charged energy storage cell if the voltage is at or above a positive threshold voltage by conducting a discharging current through the first dissipative component, wherein the first dissipative component is a three-terminal device having an output terminal, a voltage reference terminal, and a ground terminal; and
    a second dissipative component coupled directly between the voltage reference terminal and the output terminal of the first dissipative component that, when coupled to a negatively charged energy storage cell, is configured to discharge a negative voltage from the negatively charged energy storage cell, and
    wherein the second dissipative component is coupled in series to a diode, the diode coupled directly between the output terminal and the ground terminal of the first dissipative component and configured to provide a path for discharge of the negative voltage of the negatively charged energy storage cell through the second dissipative component.

2. The apparatus of claim 1, wherein the second dissipative component is further configured to discharge a positive voltage from the positively charged energy storage cell if the voltage is at or above the positive threshold voltage by conducting the discharging current through the second dissipative component when the cell is positively charged.

3. The apparatus of claim 2, wherein the second dissipative component comprises at least one of a passive dissipative component and an active dissipative component.

4. The apparatus of claim 2, wherein the second dissipative component comprises a resistor.

5. An energy storage device balancing apparatus coupled to an energy storage cell and comprising:
    a balancing circuit configured to
        discharge the energy storage cell at a first level when the energy storage cell is in a first overvoltage condition; and
    an alarm circuit configured to:
        generate an alarm when the energy storage cell is in a second overvoltage condition greater than the first overvoltage condition, and
        discharge the energy storage cell at a second level when the energy storage cell is in the second overvoltage condition.

6. The apparatus of claim 5, wherein the balancing circuit dissipates energy from the energy storage cell by conducting a discharging current through at least one of a passive dissipative component and an active dissipative component.

7. The apparatus of claim 5, wherein the alarm circuit dissipates energy from the energy storage cell by conducting a discharging current through at least one of a passive dissipative component and an active dissipative component.

8. The apparatus of claim 5, wherein the alarm circuit dissipates energy from the energy storage cell by conducting a discharging current through a resistor.

9. The apparatus of claim 5, wherein the balancing circuit comprises a shunt regulator configured to operate in a comparator mode.

10. The apparatus of claim 5, further comprising a controller configured to:
prevent dissipation of energy from the energy storage cell by the balancing circuit and the alarm circuit when the voltage is below the first reference voltage,
operate the balancing circuit to dissipate the first energy from the energy storage cell when the voltage is at or above the first reference voltage, and
operate the balancing circuit and the alarm circuit to dissipate the first and second energies from the energy storage cell when the voltage is at or above the second reference voltage.

11. The apparatus of claim 5, wherein each of the balancing circuit and the alarm circuit comprises (1) a resistive voltage divider comprising a first resistor and a second resistor and (2) a dissipative leg comprising a passive dissipative component and an active dissipative component, wherein each of the active dissipative components is configured to permit a discharging current to flow through the respective passive and active dissipative components based on a voltage output by the respective resistive voltage divider.

12. An overvoltage alarm conveying apparatus comprising:
an overvoltage alarm circuit configured to generate an overvoltage alarm signal based on a received overvoltage signal;
an isolating device configured to provide an isolated output signal in response to the overvoltage alarm signal; and
a current limiting circuit configured to provide a current flow to the isolating device when exposed to a voltage exceeding a threshold voltage, wherein the isolating device and the current limiting circuit maintain the overvoltage alarm signal generated by the overvoltage alarm circuit when the overvoltage alarm circuit is unable to maintain the overvoltage alarm signal itself.

13. The apparatus of claim 12, where the overvoltage alarm circuit comprises:
a balancing circuit coupled to an energy storage cell and configured to:
monitor a voltage of the energy storage cell; and
dissipate energy from the energy storage cell if the voltage is at or above a first reference voltage; and
an alarm circuit coupled to the energy storage cell and configured to:
generate an alarm when the voltage of the energy storage cell is at or above a second reference voltage, and
dissipate energy from the energy storage cell when the voltage is at or above the second reference voltage.

* * * * *